(12) United States Patent
Tan et al.

(10) Patent No.: US 9,171,855 B2
(45) Date of Patent: Oct. 27, 2015

(54) THREE-DIMENSIONAL NON-VOLATILE MEMORY

(71) Applicant: GLOBALFOUNDRIES Singapore Pte. Ltd., Singapore (SG)

(72) Inventors: Shyue Seng Tan, Singapore (SG); Eng Huat Toh, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 115 days.

(21) Appl. No.: 14/144,442

(22) Filed: Dec. 30, 2013

(65) Prior Publication Data

US 2015/0187784 A1 Jul. 2, 2015

(51) Int. Cl.
| | | |
|---|---|---|
| H01L 29/788 | (2006.01) | |
| H01L 27/115 | (2006.01) | |
| H01L 21/28 | (2006.01) | |
| H01L 29/78 | (2006.01) | |
| H01L 29/66 | (2006.01) | |
| H01L 29/423 | (2006.01) | |
| H01L 27/12 | (2006.01) | |
| H01L 21/84 | (2006.01) | |

(52) U.S. Cl.
CPC .... *H01L 27/11551* (2013.01); *H01L 21/28273* (2013.01); *H01L 21/845* (2013.01); *H01L 27/1203* (2013.01); *H01L 29/42328* (2013.01); *H01L 29/66795* (2013.01); *H01L 29/66825* (2013.01); *H01L 29/785* (2013.01); *H01L 29/7883* (2013.01)

(58) Field of Classification Search
None
See application file for complete search history.

(56) References Cited

U.S. PATENT DOCUMENTS

| | | | |
|---|---|---|---|
| 6,570,213 B1 * | 5/2003 | Wu | 257/315 |
| 8,148,776 B2 * | 4/2012 | Juengling | 257/331 |
| 2004/0185615 A1 * | 9/2004 | Ding | 438/257 |
| 2006/0146640 A1 * | 7/2006 | Kim | 365/232 |
| 2007/0018201 A1 * | 1/2007 | Specht et al. | 257/204 |
| 2007/0018237 A1 * | 1/2007 | Kim et al. | 257/324 |
| 2013/0037877 A1 * | 2/2013 | Tan et al. | 257/316 |

OTHER PUBLICATIONS

Shinji Kawai et al., An 8kB EEPROM-Emulation DataFLASH Module for Automotive MCU, IEEE International Solid-State Circuits Conference, 2008, pp. 508-509 & pp. 632, ISSCC 2008, IEEE, Japan.
SST, SuperFlash Cell Technology, http://www.sst.com/superflash/superflash_cell/, copyright 2011, Silicon Storage Technology, Inc.
Young-Joon Choi, Managing Challenges on Reliability and Applications from NAND Flash Scaling, IEDM Short Course, Dec. 4, 2011, pp. 1-37, CTO, ADATA Technology.

* cited by examiner

*Primary Examiner* — Benjamin Sandvik
*Assistant Examiner* — Herve Assouman
(74) *Attorney, Agent, or Firm* — Horizon IP Pte. Ltd.

(57) ABSTRACT

A three-dimensional one-transistor non-volatile memory device and a manufacturing method thereof are provided. The memory device includes a primary fin disposed on a substrate along a first direction, first and second secondary fins disposed on the substrate along a second direction, and a first gate of a first memory cell disposed on the substrate in a gate region thereof. The first gate includes a program gate, a floating gate and a control gate.

20 Claims, 15 Drawing Sheets

THREE-DIMENSIONAL NON-VOLATILE MEMORY

BACKGROUND

Non-volatile memory (NVM) devices are in general memory devices that retain, or store, data even when not powered. Presently, NVM devices are utilized in a wide range of applications including, for example, smart cards, microcontrollers (MCU), mobile phones, digital cameras, memory cards, and other applications where power is not always available, power is frequently interrupted, or lower power usage is required. Typical NVM devices include, for example, Erasable and Programmable Read Only Memory (EPROM) devices, Electrically Erasable and Programmable Read Only Memory (EEPROM) devices, Static Random Access Memory (SRAM) and flash memory. NVM devices are widely implemented in the form of embedded memory.

In recent years, various types of cells, storage mediums and program-and-read technologies have been developed. For instance, cell types of a memory cell include one-transistor (1T) cell, two-transistor (2T) cell and split-gate cell. Types of storage mediums include, for example, silicon-oxide-nitride-oxide-silicon (SONOS), floating gate (FG) and silicon nanocrystal (Si-nc). Program-and-read technologies include, for example, channel hot electron (CHE)/Fowler-Nordheim tunneling (FN), FN/FN and small scale integration (SSI)/FN. Regardless of the technologies utilized in a memory device, the reliability endurance and data retention of the memory device are critical factors to the performance of the NVM device.

In one existing design of memory cells of NVM devices, separate read and write (program) channels are utilized by increasing the cell size. The resulting cell is less prone to deterioration because no write stress is applied to the tunnel oxide layer for the read channel. Accordingly, with reduced degradation on the read channel, such design offers improved retention and endurance (e.g., $1 \times 10^6$ cycles). However, one shortcoming of such design is large cell size with decoupled program and read channels.

In another existing design of memory cells of NVM devices, separate read channel and erase channel are utilized. The memory cell has sharp corner with wrap-around in device geometry which facilitates forward electron tunneling and prevents anode hole injection and stress-induced leakage current to improve reliability. Such design offers good endurance (e.g., $1 \times 10^6$ cycles) compared to conventional stack-gate FG-type NVM. Additionally, in such design, the source line is non-silicided and thus has a higher resistive path for the source line. However, one shortcoming is the high resistance in the source line which tends to affect the performance.

Moreover, due to the ever-shrinking dimensions of semiconductor devices including NVM devices, interference such as floating gate-to-floating gate (FG-FG) interference has become a key limiting factor for memory cell scaling in flash memory devices, which is a type of NVM device.

Accordingly, there remains a need for a new design of memory cells of NVM devices, and a manufacturing method thereof, to address the aforementioned issues.

SUMMARY

Embodiments generally relate to three-dimensional (3D) one-transistor (1T) NVM devices with poly-to-poly program and a manufacturing method thereof. In one embodiment, a memory device in accordance with the present disclosure may include the following features: a primary fin disposed on a substrate along a first direction; first and second secondary fins disposed on the substrate along a second direction; and a first gate of a first memory cell disposed on the substrate in a gate region thereof. The first gate may include a program gate, a floating gate and a control gate. The program gate may be disposed on the substrate, where the program gate may be displaced from the primary fin by a dielectric block which is disposed on the substrate and adjacent to the primary fin. The dielectric block may have a height which is less than that of the program gate. The floating gate may be disposed over the program gate. The program gate may be separated from the floating gate and the primary fin by an inter-gate dielectric. The floating gate may include a floating gate tip disposed adjacent to the program gate and the dielectric block and between the program gate and the primary fin. The control gate may be disposed adjacent to the floating gate and the program gate. The control gate may be separated from the substrate, the program gate, and the floating gate by the inter-gate dielectric.

In another embodiment, a method of manufacturing a memory device may include: forming a primary fin on a substrate along a first direction; forming first and second secondary fins on the substrate along a second direction; and forming a first gate of a first memory cell on the substrate in a gate region thereof. In forming the first gate, the method may perform operations including: forming a program gate on the substrate; forming a dielectric block on the substrate and adjacent to the primary fin, wherein the program gate is displaced from the primary fin by the dielectric block, and wherein the dielectric block has a height which is less than that of the program gate; forming a floating gate over the program gate, wherein the floating gate comprises a floating gate tip disposed adjacent to the program gate and the dielectric block and between the program gate and the primary fin; forming an inter-gate dielectric, wherein the program gate is separated from the floating gate and the primary fin by the inter-gate dielectric; and forming a control gate adjacent to the floating gate and the program gate, wherein the control gate is separated from the substrate, the program gate, and the floating gate by the inter-gate dielectric.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the present disclosure. In the following description, various embodiments of the present disclosure are described with reference to the following drawings, in which.

DETAILED DESCRIPTION

Embodiments generally relate to three-dimensional (3D) one-transistor (1T) NVM devices with poly-to-poly program and a manufacturing method thereof. An NVM device according to the present disclosure offers a number of novel features vis-à-vis existing designs of NVM devices. Firstly, an erase operation in an NVM device according to the present disclosure is through poly-to-poly FN via a path from the corner of a program gate (PG) to a corresponding floating gate (FG). Secondly, dedicated cell program operation is through FN from tip of FG to a bit line (BL) fin by applying a bias voltage on a control gate (CG) and the BL. Thirdly, a memory cell of the NVM device according to the present disclosure is read like a transistor, as bit line (drain), and source line is a common source shared by multiple memory cells. Fourthly, each of the numerous fins of the NVM device is shared by two adjacent memory cells. Fifthly, the novel design features an L-shaped CG to improve coupling ratio over stack-gate cell. Moreover, the process of manufacturing the NVM device according to the present disclosure is compatible with a bulk FinFET (fin field effect transistor) process which is known in the art.

Accordingly, the present NVM device offers a number of advantages compared to existing NVM devices. For instance, size of the memory cell is compact. Additionally, FG-FG interference in an NVM device according to the present disclosure is suppressed. Also, as non-buried source lines that are silicided are utilized, SL resistance in an NVM device according to the present disclosure is lowered. Furthermore, the current for memory cell read operation (Lead) is increased with higher fin height.

Figure 1:
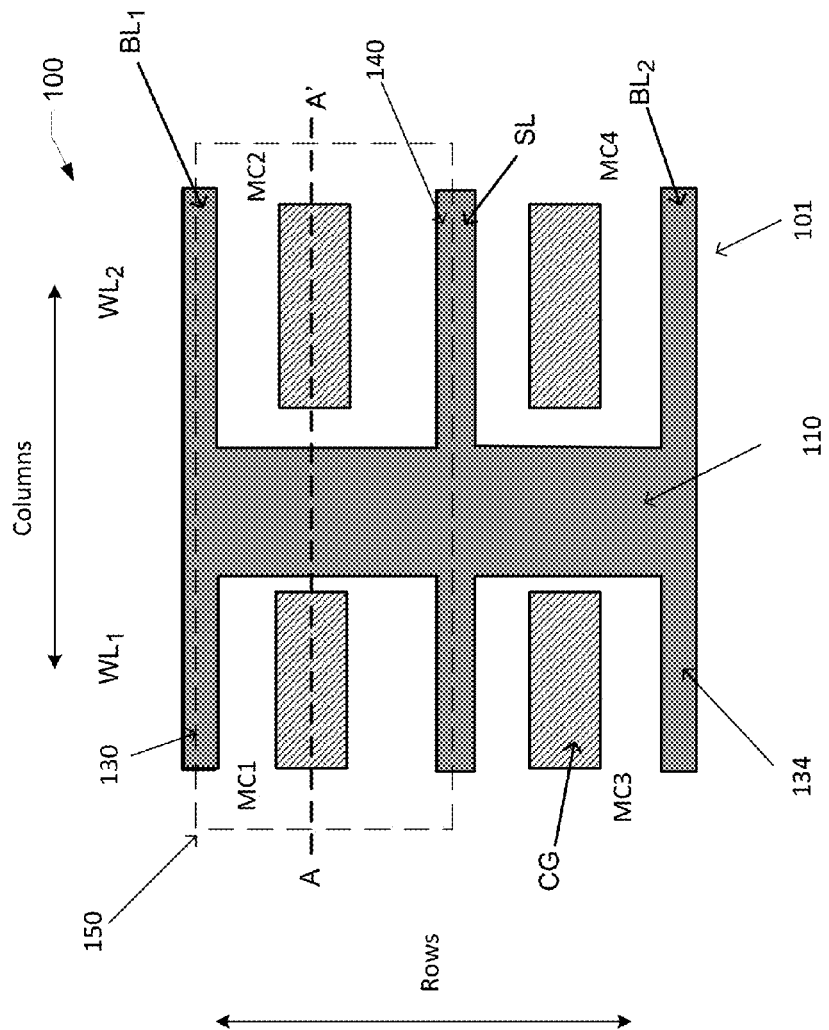
FIG. 1 is a top view of a non-volatile memory device in accordance with one embodiment of the present disclosure.
Figure 2:
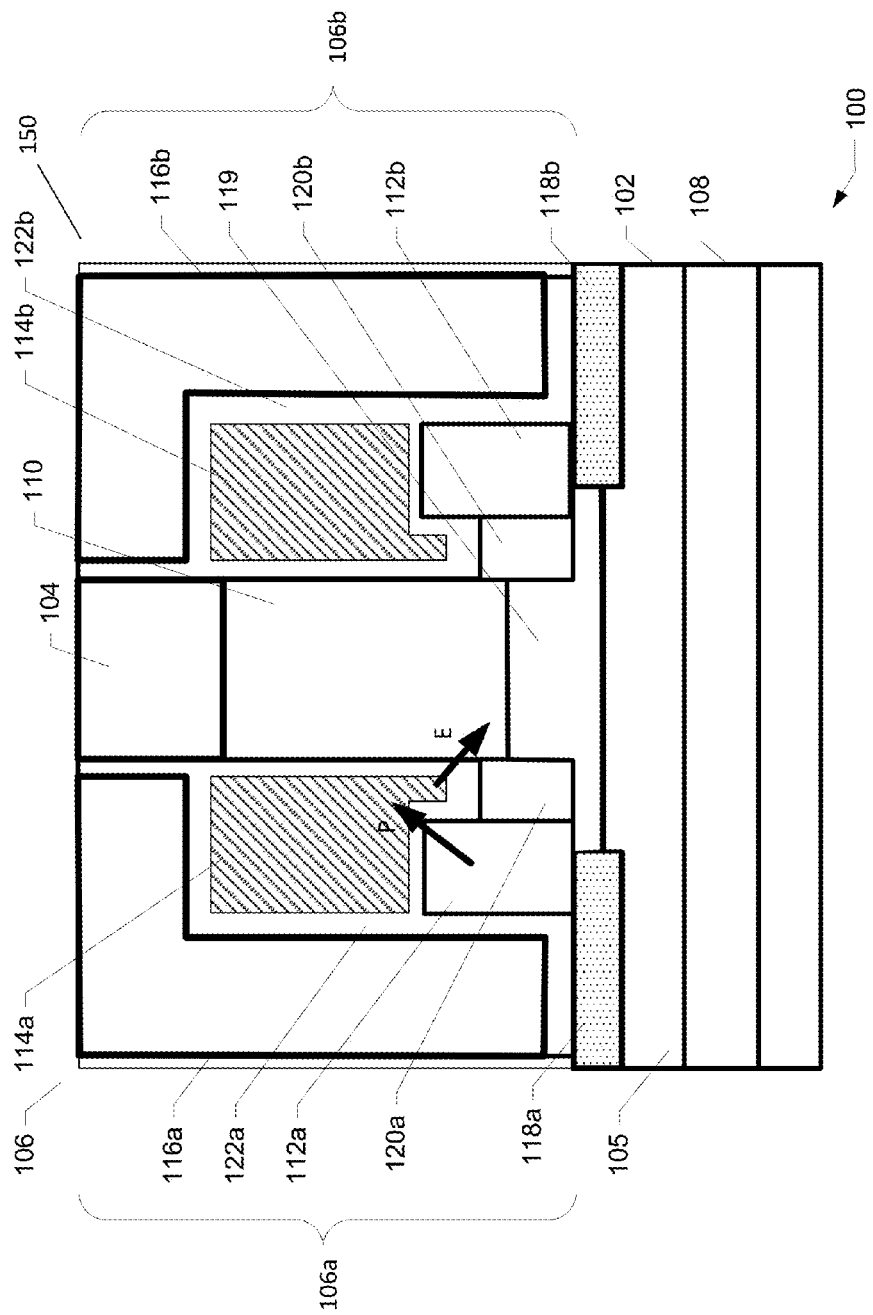
FIG. 2 is a cross-sectional view of the non-volatile memory device of FIG. 1 along line A-A'.

FIGS. 1-2 illustrate top and cross-sectional (along A-A') views of an exemplary embodiment of an NVM device 100. As shown, the NVM device 100 includes a portion of an array of NVM memory cells. The portion includes four memory cells MC1-MC4 arranged in a 2×2 matrix to form a memory cell block 101 of the array. It is understood that an array may include a plurality of memory cells or blocks interconnected to form rows and columns of memory cells, with bit lines (BLs) and source lines (SLs) in the column direction and word lines (WLs) in the row direction. The row and column directions, for example, are perpendicular to each other. Other configurations of row and column directions may also be useful.

In one embodiment, the memory cell block is configured to include two memory cell pairs. For example, MC1 and MC2 form a first memory cell pair 150 while MC3 and MC4 form a second memory cell pair of the block.

Referring to FIG. 2, the NVM device 100 is disposed on a semiconductor substrate 102 which may be, for example, a silicon substrate. Other types of substrates may also be useful. In one embodiment, the substrate 102 is a lightly doped p-type (P⁻) substrate. The substrate 102 has a first primary side (e.g., the top side) and a second primary side (e.g., the bottom side) opposite the first primary side. The substrate 102 includes a well region 108 therein that is doped with dopants of a first polarity type. For example, the well region 108 may be a deep N well (DNW) which is formed within the substrate 102 between the first primary side and the second primary side of the substrate 102. The well, for example, serves as an isolation well to electrically isolate the memory cells from the substrate 102.

The substrate 102 includes fins protruding from the first primary side. The fins are elongated members having, for example, a rectangular cross-sectional shape. For example, a fin includes a top with first and second sides, such as right and left sides. Other types of fins may also be useful. As shown in FIG. 1, a first or primary fin 110 is disposed on the substrate 102 and extends along the row direction. Also shown in FIG. 1, secondary fins 130, 134 and 140 are disposed on the substrate 102 and extend along the column direction which may be perpendicular to the row direction. The primary and secondary fins may be integral to the substrate 102. For example, the fins may be formed by patterning the substrate. Alternatively, the fins may be epitaxial layers formed on the substrate 102.

Memory cells are disposed in areas on the substrate 102 between the fins. As shown in FIG. 2, the primary fin 110 separates two adjacent memory cells in the column direction. For example, MC1 and MC2 of the memory cell pair 150 are disposed on opposite sides of the primary fin 110. Similarly, MC3 are MC4 are disposed on opposite sides of the primary fin 110. The primary fin 110 separates two columns of memory cells, with MC1 and MC3 on one column and MC2 and MC4 on the other column. For example, a first WL (WL$_1$) is coupled to MC1 and MC3 while a second WL (WL$_2$) is coupled to MC2 and MC4. Secondary fins 130 and 134 serve as BLs (e.g., BL$_1$ and BL$_2$) of two adjacent rows of memory cells while secondary fin 140 serves as a shared or common SL disposed between BL$_1$ and BL$_2$. As shown, MC1 and MC2 form a row of memory cells coupled to BL$_1$ and MC3 and MC4 form another row of memory cells coupled to BL$_2$. The two rows of memory cells share the common SL disposed between the two rows. For example, MC1 and MC3 are disposed on the opposite side of the common SL with respect to MC2 and MC4.

As described, memory cells of a memory cell pair share a primary fin and a BL and a SL. Furthermore, adjacent memory cell pairs in the row direction share a common SL.

As shown in FIG. 2, a memory cell includes a gate stack 106. For example, as shown in FIG. 2, the gate stack may include first and second gate stacks 106a and 106b that are disposed on opposing sides of the primary fin 110. The gate stacks 106a and 106b, in one embodiment, are configured as mirror images of one another other in the cross-sectional view.

Each of the gate stacks 106a and 106b respectively includes first, second and third gates 112a, 114a and 116a or 112b, 114b and 116b, respectively. The gates serve as various gates of a NVM cell. In one embodiment, the first gate 112a/112b serves as a program gate (PG), the second gate 114a/114b serves as a floating gate (FG) and the third gate 116a/116b serves as a control gate (CG). The gates, for example, are polysilicon. Other types of gate materials may also be useful. For example, for the floating gate 114a/114b, the material may be silicon (Si) or polysilicon. Moreover, for the program gate 112a/112b and control gate 116a/116b, the material may be metal so that they may be metal gates.

In one embodiment, the PG 112a/112b is disposed over the substrate 102 and displaced from a respective side of the primary fin 110. A dielectric block 120a/120b is disposed between the PG 112a/112b and the respective side of the primary fin 110. The dielectric block 120a/120b, for example, may be silicon oxide. Other types of dielectric blocks for isolating the PG 112a/112b from the primary fin 110 may also be useful. The dielectric block 120a/120b also serves to displace the PG 112a/112b farther away from the primary fin 110 than is the FG 114a/114b. In one embodiment, the top of the PG 112a/112b is disposed above the top of the dielectric block 120a/120b. Disposed above the PG 112a/112b and dielectric block 120a/120b is the FG 114a/114b. The CG 116a/116b is disposed adjacent to the FG 114a/114b. The gates are separated from each other as well as from the primary fin 110 by an inter-gate dielectric 122a or 122b, respectively. The inter-gate dielectric 122a/122b is disposed between the FG 114a/114b and the respective side of the primary fin 110 as well as between the FG 114a/114b, PG 112a/112b and CG 116a/116b. The inter-gate dielectric 122a/122b, for example, may be an oxide. The inter-gate dielectric 122a/122b may be silicon oxide. The inter-gate dielectric 122a/122b may be composed of a plurality of inter-gate dielectric layers. Other types or configurations of inter-gate dielectric may also be useful. For example, inter-gate dielectric thickness may range from about 5 nm to about 50 nm.

In one embodiment, the FG 114a/114b wraps around an adjacent corner of the PG 112a/112b. The dielectric block 120a/120b, by displacing the PG 112a/112b farther away than the primary fin 110, facilitates the wrapping-around of FG 114a/114b with respect to the PG 112a/112b. As shown in FIG. 2, the FG 114a/114b wraps around an adjacent corner of the PG 112a/112b proximate to the primary fin 110. The wrap-around of the FG 114a/114b creates a FG tip above the dielectric block 120a/120b.

The CG 116a/116b is disposed on or adjacent to the FG 114a/114b. A word line is coupled to the CG 116a/116b of the gate stack 106a/106b. In one embodiment, the CG 116a/116b wraps around the FG 114a/114b. The CG 116a/116b is disposed over the top and an exposed side (which is distal from the primary fin 110) of the FG 114a/114b. As shown in FIG. 2, the CG 116a/116b wraps around the FG 114a/114b and is disposed over the exposed side of the PG 112a/112b. For example, the CG 116a/116b may include an L-shaped contour in the cross-sectional view and is disposed over the top of the FG 114a/114b as well as on a side of the FG 114a/114b and PG 112a/112b. Other configurations of the CG 116a/116b may also be useful.

A hard mask 104 may be disposed over the primary fin 110 between the adjacent gate stacks 106a/106b. The hard mask 104, for example, may be silicon oxide. Other types of hard masks may also be useful. In one embodiment, the hard mask 104 is disposed on a portion of the primary fin 110 between the adjacent gate stacks 106a/106b. The hard mask 104 may be a part of the hard mask used to pattern or form the fins. The hard mask 104, for example, may serve as an implant block for forming source and drain regions of the NVM device 100. The hard mask 104 is needed to define self-aligned PG and FG formation as well as to serve as source-drain (SD) implant mask. The portion of the primary fin 110 disposed below the hard mask 104 serves as the channel of the memory cell transistor. In some embodiments, no mask is disposed over the portion of the primary fin 110 between adjacent gate stacks. For example, the hard mask 104 may be removed after forming source and drain regions.

The fins may include lower and upper fin portions. In one embodiment, the interface of the upper and lower fin portion may be disposed below the top surface of the dielectric block 120 and above the top surface of the substrate 102. The upper portion may serve as a body of the transistor. For example, the upper fin portion, as body of the transistor, may be doped with second polarity type dopants. The body, for example, may be lightly or intermediately doped with second polarity type dopants. The body serves as a body for a first polarity type device. For example, the body may be a p-type body for an n-type device. The lower fin portion includes a first doped well 119 of first polarity type dopants. The first doped well 119, in one embodiment, extends into the substrate 102 below the primary fin 110. The first doped well 119 may be lightly or intermediately doped with first polarity type dopants. For example, the first doped well 119 may be an n-well (NW) disposed below a p-type body. The first doped well 119 serves to isolate the body of the transistor from the substrate 102. As shown, the first doped well 119 extends beyond the sides of the primary fin 110 to an interface of the PG 112a/112b as well as the dielectric block 120a/120b.

A second doped well 118a/118b is disposed in the substrate 102 below the respective gate stack 106a/106b. For example, the second doped well 118a is disposed below the CG 116a and PG 112a, and the second doped well 118b is disposed below the CG 116b and PG 112b. The second well 118a/118b is doped with second polarity type dopants. The second doped well 118a/118b, for example, may be a highly or heavily doped well with second polarity type dopants. In one embodiment, the second doped well 118a/118b extends below the bottom of the first doped well 119, ensuring that the first doped well 119 is not disposed below it. This helps to isolate the PG 112a/112b from the primary fin 110. The second doped well 118a/118b also serves as an electrical contact to the PG 112a/112b.

The first and second doped wells 119 and 118a/118b are separated from the deep well 108 by a substrate separation region 105. The substrate separation region 105, for example, is a lightly or intermediately doped region with second polarity type dopants. This, for example, may be the lightly doped second polarity type substrate. In the case that the substrate 102 is not doped with the same type of dopants as the second doped well 118a/118b, a third doped well may be provided above the deep well 108 between the first and second doped wells 119 and 118a/118b to serve as the substrate separation region 105.

The primary fin 110 and secondary fins 140, 130 and 134 include source and drain regions of the memory cell. The source and drain regions are heavily doped regions with first polarity type dopants. In one embodiment, the secondary fin 130 which serves as a BL and the portion of the primary fin 110 adjacent the drain side of the gate include the drain region while the secondary fin 140 which serves as a SL and the portion of the primary fin 110 adjacent the source side of the gate include the source region. The portion of the primary fin 110 between the drain and source side of the gate serves as a channel of the memory cell. The present memory cell performs a program operation through poly-to-poly tunneling effect (e.g., FN) from the PG 112a/112b corner to the FG 114a/114b, as indicated by the arrow P in FIG. 2. During a program operation electrons are injected into the FG 114a/114b while during an erase operation electrons are extracted from the FG 114a/114b. The arrows in FIG. 2 indicate electron movement. Specifically, the arrow P indicates electron movement during the program operation and the arrow E indicates electron movement during the erase operation. By using the PG corner, more efficient program operation is achieved. With tip, electron emission from the PG 112a/112b is more efficient and, hence, results in better program operation. As for the erase operation, it is from the FG tip to the BL, as shown by the arrow E. A read channel of the memory cell is from the BL (drain) to the SL (source). As described, the memory cell includes the CG 116a/116b which wraps around at least the FG 114a/114b, creating an L-shape CG. Providing an L-shaped CG, as shown in FIG. 2, advantageously improves coupling ratio of the gate stack of a cell. This reduces FG-FG interference between cells, thereby improving scalability.

Figure 3:
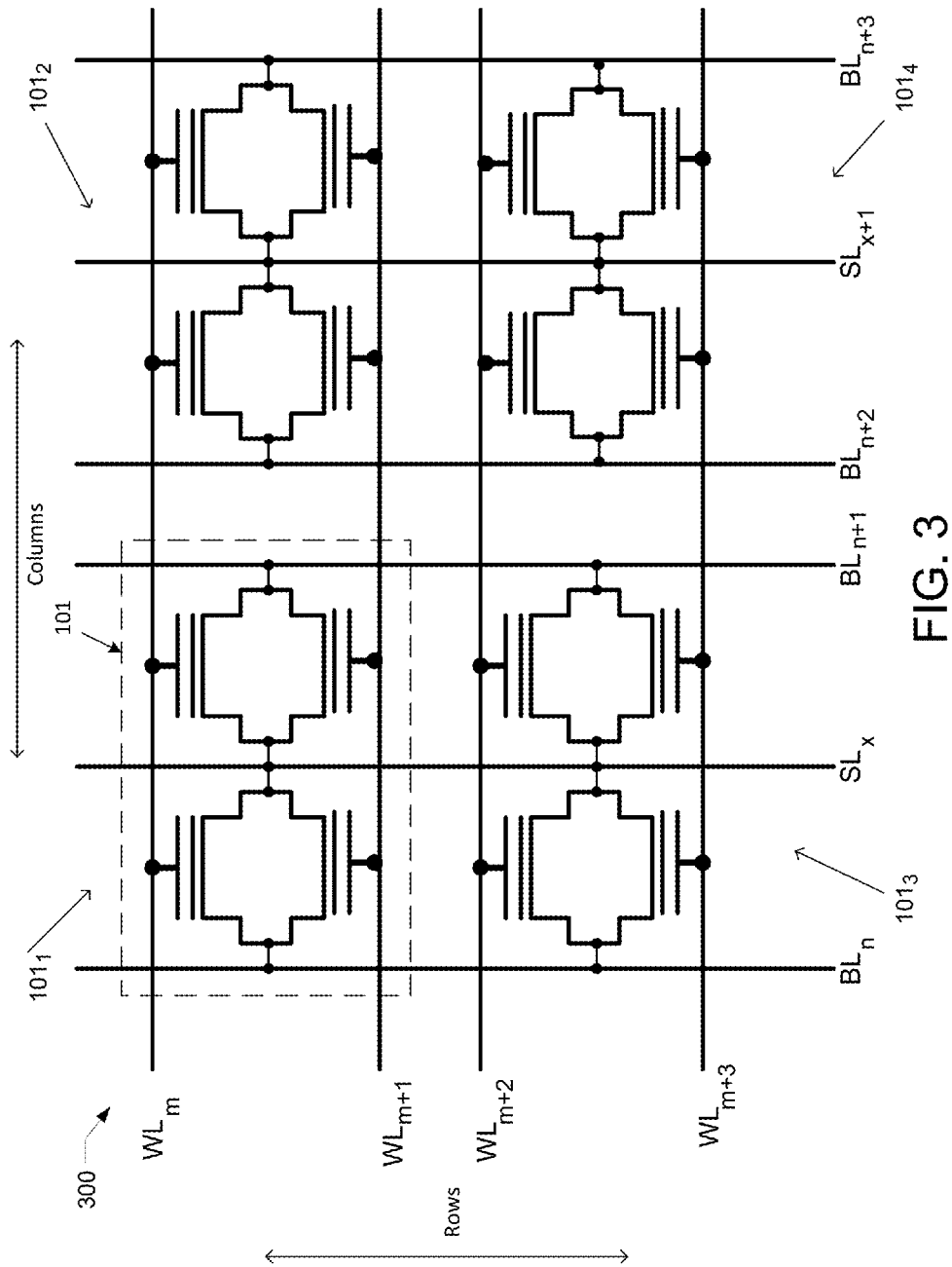
FIG. 3 is a top view of an array of memory cells of a non-volatile memory device in accordance with one embodiment of the present disclosure.

FIG. 3 shows a schematic diagram of an embodiment of a portion of an array 300. The portion illustrates an exemplary array configuration of NVM cells. As shown, the portion includes a plurality of memory blocks 101. For example, the portion includes four memory blocks 101$_1$-101$_4$. Each memory block may be similar to that described in FIGS. 1-2. Common elements are not described or described in detail in the interest of brevity. Each memory block, for example, includes four memory cells arranged in as a 2×2 matrix. The illustrated portion includes two memory blocks in the row direction and two memory blocks in the column direction, producing a 4×4 matrix of memory cells interconnected by four WLs (WL$_m$, WL$_{m+1}$, WL$_{m+2}$ and WL$_{m+3}$), four BLs (BL$_n$, BL$_{n+1}$, BL$_{n+2}$ and BL$_{n+3}$) and 2 SLs (SL$_x$ and SL$_{x+1}$).

As shown, the WLs are along a row direction and BLs and SLs are along a column direction. Adjacent blocks in the column direction are coupled by first and second WLs. For example, first and second blocks are coupled to WL$_m$ and WL$_{m+1}$ while third and fourth blocks are coupled to WL$_{m+2}$ and WL$_{m+3}$. Adjacent blocks in the row directions share first and second BLs and a SL. For example, gates of memory cells in first and third blocks share BL$_n$ and BL$_{n+1}$, with common SL$_x$ while gates of memory cells in second and fourth blocks share BL$_{n+2}$ and BL$_{n+3}$, with common SL$_{x+1}$. Other configurations of memory blocks may also be useful. It is understood that the array may include more blocks arranged in the row and column directions.

Figure 4:
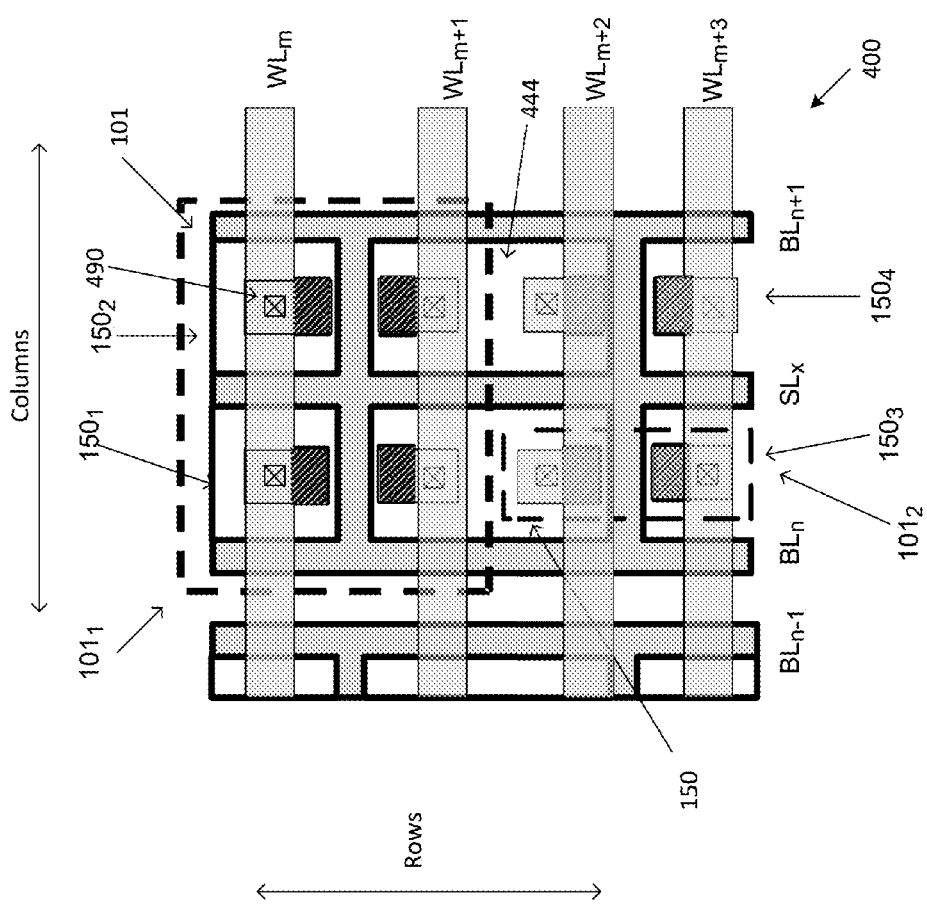
FIG. 4 is a schematic diagram of the memory cells of the non-volatile memory device of FIG. 3.

FIG. 4 shows a layout of an embodiment of a portion of an array 400. The portion illustrates an exemplary array configuration of NVM cells. As shown, the portion includes a plurality of memory blocks. For example, the portion includes two blocks 101$_1$ and 101$_2$. A memory block may be similar to that described in FIGS. 1-2. Common elements are not described or described in detail in the interest of brevity. The memory block, for example, includes four memory cells arranged in a 2×2 matrix. The portion includes two memory blocks in the row direction, producing a 4×2 matrix of memory cells interconnected by four WLs (WLm, WL$_{m+1}$, WL$_{m+2}$ and WL$_{m+3}$), two BLs (BL$_n$ and BL$_{n+1}$) and a SL (SL$_x$).

The layout includes primary fins in the column direction with secondary fins extending from the primary fins in the row direction. For example, a memory cell pair 150 in the row direction is disposed on opposite sides of a primary fin. As shown, the blocks include four memory cell pairs 150$_{1-4}$. The primary fins and secondary fins form a rectangular cell area 444. Adjacent memory cells of adjacent memory cell pairs in the column direction are disposed in the cell areas. A column of blocks, for example, may include more than two blocks. A column includes first and second secondary fins which correspond to BLs (e.g., BL$_n$ and BL$_{n+1}$) with a secondary fin corresponding to a SL (e.g., SL$_x$) disposed therebetween. At the ends of a column, the BLs and SLs are separated, as depicted. It is understood that an array is configured with a plurality of columns of blocks, interconnected by WLs.

As shown, WLs are disposed along the row direction. WLs, for example, are formed of a metal, such as copper or copper alloy. Other types of metals may also be useful. The WLs are disposed in a metal level of the device. Contacts 490 are provided to connect the WLs to the CG of the memory cells. SLs, BLs and PGLs (not shown) may be provided in a metal level and connected to respective terminals of the memory cells. For example, SLs are coupled to secondary SL fins, BLs are coupled to secondary BL fins and PGLs are coupled to second wells of the memory cells by contacts.

Various operations, such as erase, program and read operations are performed by providing appropriate bias voltages to appropriate terminals of the memory array. For example, appropriate bias voltages are applied to WLs, BLs, PGLs and SLs to perform the desired operation on a selected cell. In the case of erase operation, page erase may be performed. The bias voltages for selected and unselected cells are shown in Table 1 below:

TABLE 1

| | BL | | WL (CG) | | PGL | | |
| --- | --- | --- | --- | --- | --- | --- | --- |
| Operation | Sel | Unsel | Sel | Unsel | Sel | Unsel | SL |
| Read | $V_{ref}$ | 0 V | $V_{cc}$ | 0 V | Float | Float | 0 V |
| Page Program | 0 V | 0 V | 0 V | 0 V | $-V_{ee}$ | 0 V | 0 V |
| Erase | $V_{PP}$ | 0 V | $-V_p$ | 0 V | 0 V | 0 V | 0 V |

Various voltages for $V_{ref}$, $V_{cc}$, $V_{pp}$, $-V_{ee}$ and $V_p$ may depend on the technology. Table 2 below shows exemplary voltages for 40 nm configuration.

TABLE 2

| Voltage Symbol | Voltage Value |
| --- | --- |
| $V_{ref}$ | +1.1 V |
| $V_{cc}$ | +1.1 V |
| $V_{pp}$ | +10 V |
| $V_p$ | −6 V |
| $V_{ee}$ | −14 V |

Figure 5A:
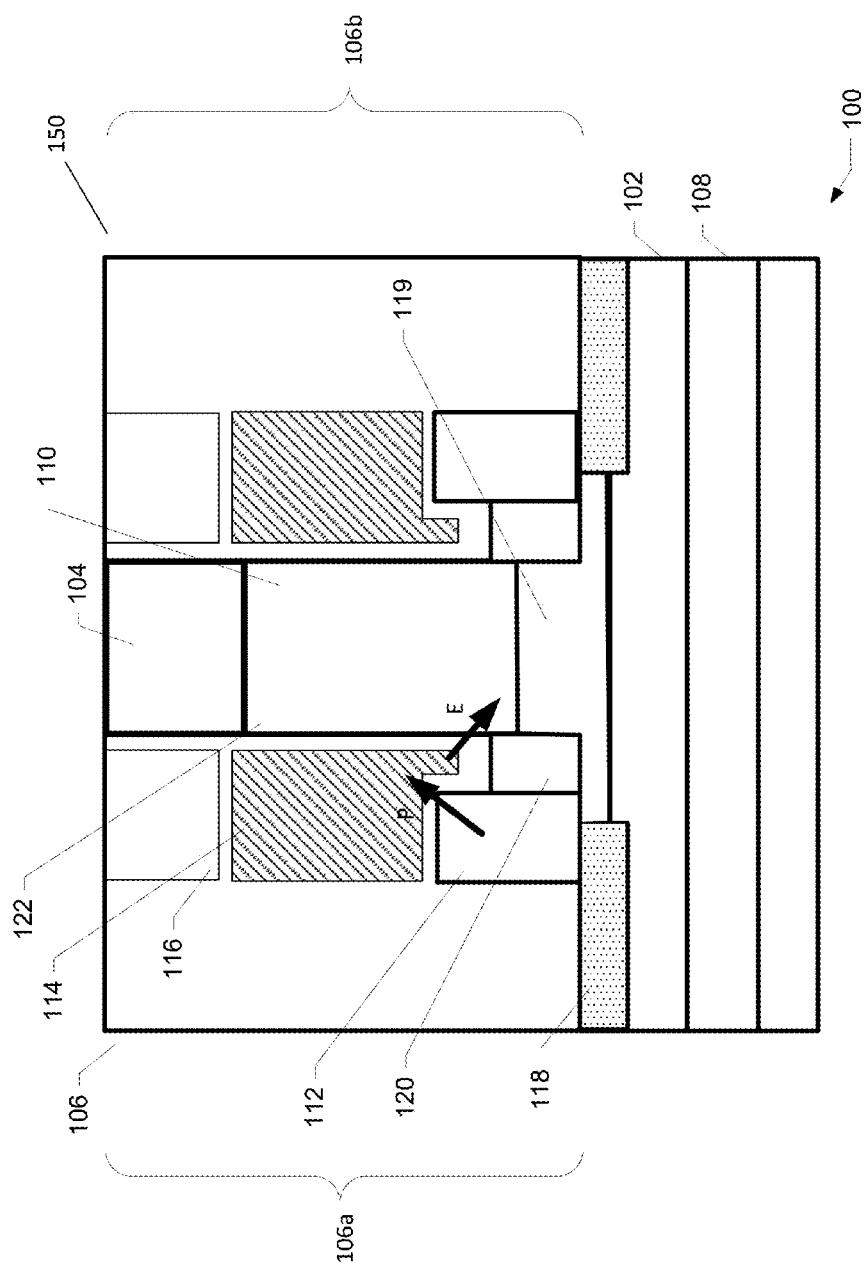
FIGS. 5a-5c show cross-sectional views of alternative embodiments of NVM cells in accordance with one embodiment of the present disclosure.
Figure 5B:
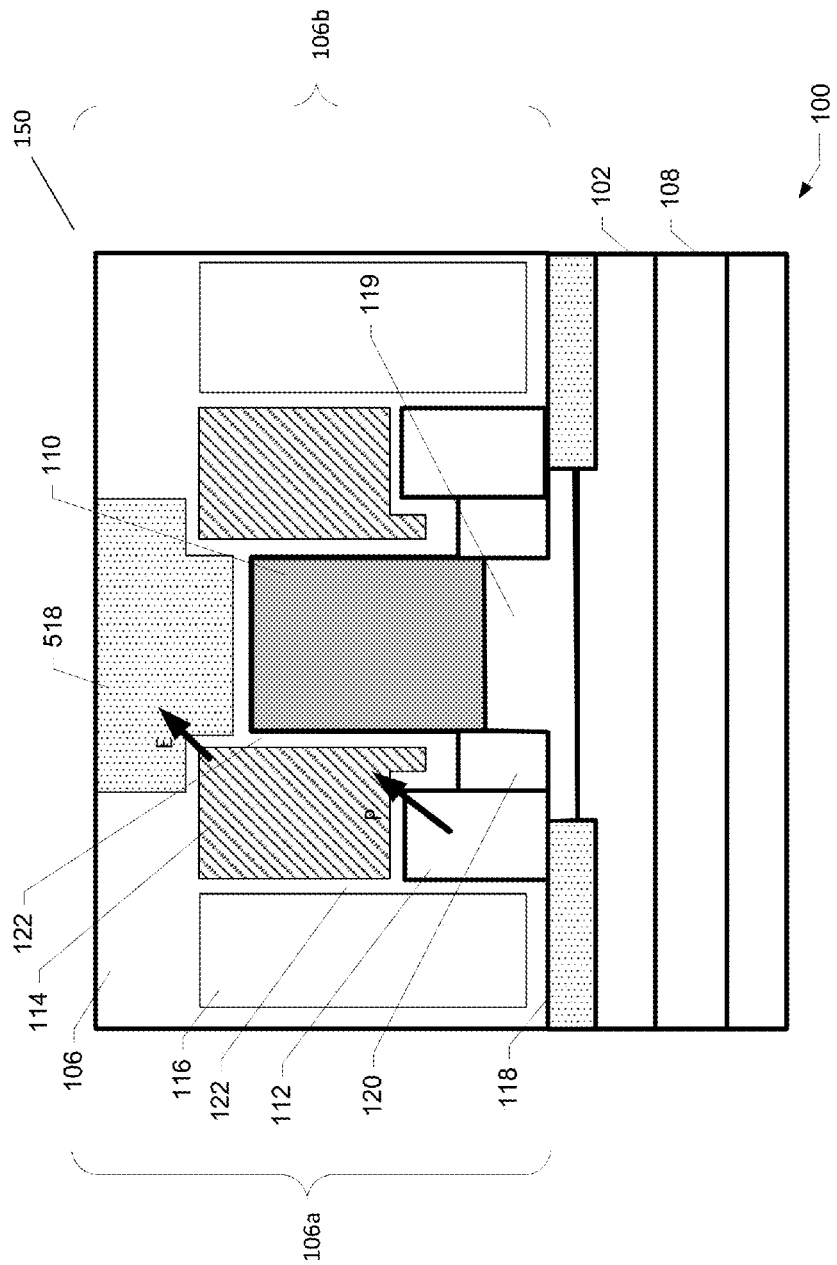
Figure 5C:
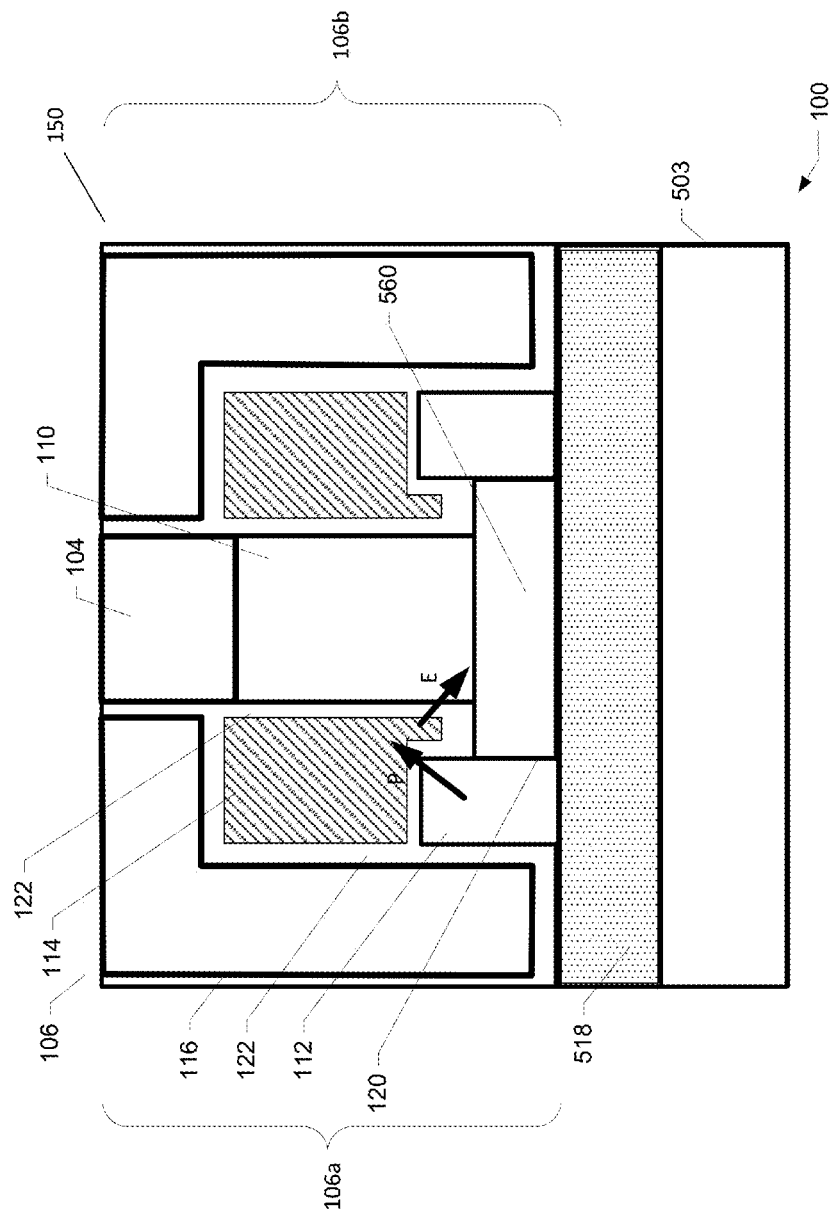

FIGS. 5a-5c show cross-sectional views of alternative embodiments of NVM cells. For example, alternative embodiments of memory cell pairs of a block are shown. The memory cell pairs are similar to that described in FIGS. 1-2. Common elements are not described or described in detail in the interest of brevity.

Referring to FIG. 5a, a gate stack 106 includes a CG 116 which is disposed over a top surface of the FG 114. For example, the CG does not wrap around the FG and PG. By not wrapping around the FG and PG, the cell area is reduced and, thus, results in lower coupling ratio. However, the present design can tolerate low coupling ratio due to poly-to-poly programming.

As for FIG. 5b, a memory cell includes an erase gate 518 disposed above the fin 110 and the FG 114. The erase gate is common erase gate to the cells of the cell pair 150. Providing an erase gate decouples program and erase channels, as shown by P and E arrows. The erase gate, as shown, wraps around a corner of the FG adjacent to the primary fin. Erasing through the corner of the FG increases erase efficiency. The erase gate is coupled to an EGL. The EGL, for example, is disposed in the row direction, and is disposed on top of the primary fin where the hard mask is located. To accommodate the erase gate, the CG 116 is not disposed on top of the FG 114. For example, the CG is disposed on the sides of the FG and PG. The EG is positively biased to extract electrons out from the FG.

Referring to FIG. 5c, the memory cell is formed on a crystalline-on-insulator (COI) substrate, such as a silicon-on-insulator substrate. A COI substrate includes a bulk crystalline substrate 503 and a surface crystalline substrate sandwiching an insulator layer 560, such as silicon oxide. The insulator layer may be referred to as a buried oxide (BOX) layer. In one embodiment, the surface substrate is patterned to form fins over the insulator layer. The insulator layer is also patterned to expose the cell regions, leaving the insulator layer beneath the fin. The insulator layer is patterned to include the area occupied by the dielectric block used to displace the PG from the fin to create a tip for the FG. There is one single well 518 underneath BOX 560. The single well 518 is configured to connect to the PGs 112 since page program mode is used. In one embodiment, the single well 518 is a p-well that serves as an electrical contact for the PGs. The height of the fin may be tailored depending on read current requirement. The higher the fin is, the larger the cell current will be, thereby providing another optimization window. The COI substrate can be applied to NVM cells described in FIGS. 1, 2, 5a and 5b. For example, the BOX 560 can be used to replace the dielectric blocks and first well (e.g., n-well).

FIGS. 6a-6h show cross-sectional views of an embodiment of a process 600 for forming a device or IC. The process depicted shows a process for forming a pair of NVM memory cells, such as that described in FIGS. 1 and 2. The view is taken along A-A'. Common elements may not be described or described in detail.

Figure 6A:
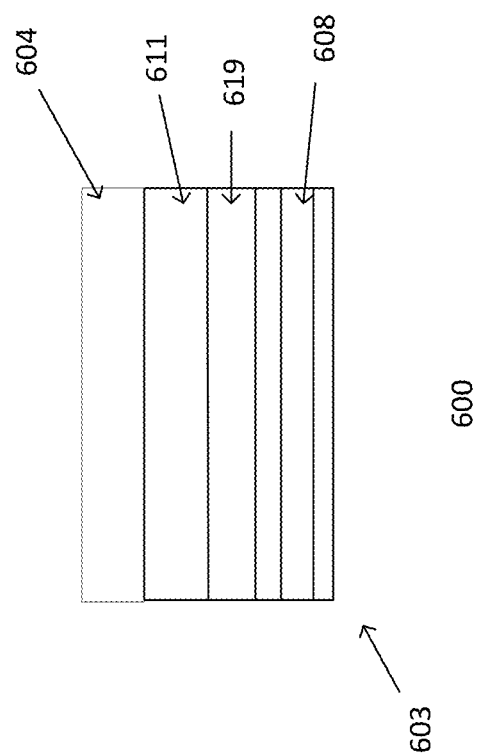
FIGS. 6a-6h show cross-sectional views of an embodiment of a process for forming a device in accordance with one embodiment of the present disclosure.

Referring to FIG. 6a, a substrate 603 is provided. The substrate may be a silicon substrate. The substrate may be lightly doped with, for example, p-type dopants. Providing other types of substrates, including SiGe, Ge and group III-V semiconductors such as GaAs, InP and InAs, including substrates doped with other types of dopants or undoped substrates, are also useful.

The substrate, as shown, is prepared with a deep well 608. In one embodiment, the deep well is a doped region of a first polarity type. For example, the deep well is an n-type doped well. The deep well serves as an isolation well for the memory cells. The substrate is further prepared with a first well 619. The first well is a doped region of a first polarity type. The first well, for example, is an n-well. The wells, for example, are lightly or intermediately doped wells. The wells may be formed by implanting first polarity type dopants. The implant energy and dose are tailored to form the deep and first well. The wells may be formed by multiple implants to achieve the desired profile. Separating the wells is a separation region. The separation region, for example, is the same as the substrate, such as the lightly doped p-type substrate.

Above the first well is a surface substrate region 611. The surface substrate region may have the same doping as the substrate. For example, the surface substrate region is a lightly doped p-type region. The surface substrate region is tailored to meet design requirements. For example, the thickness of the surface region is tailored to satisfy read current requirements of the memory cell. The thickness may be selected based on the height of the upper portion of the subsequently formed fin or fins. The thickness of the surface region may be about 100 nm. Other thicknesses may also be useful.

Disposed on the surface substrate region is a hard mask 604. The hard mask, for example, is a $SiO_2$, $Si_3N_4$, SiON hard mask. Other types of hard masks may also be useful. The hard mask may be formed by, for example, chemical vapor deposition. Other techniques may also be used to form the hard mask.

Figure 6B:
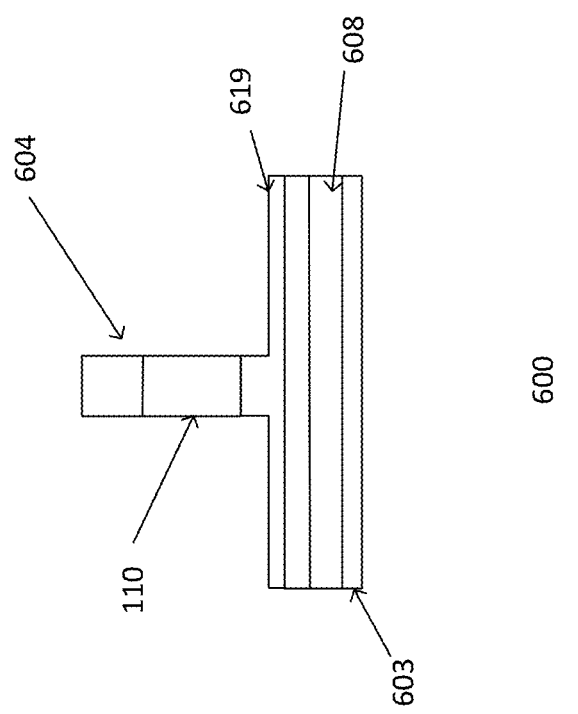

Referring to FIG. 6b, the hard mask is patterned to form a patterned hard mask 604. Patterning the hard mask may be achieved using a soft mask, such as photoresist. The photoresist is patterned by exposing it with an exposure source using a reticle with the desired pattern. To improve lithographic resolution, an ARC can be provided beneath the photoresist. Other techniques for patterning the gate layers may also be useful. After exposure, the photoresist is developed, transferring the reticle pattern to form a patterned photoresist. The patterned photoresist is used to etch the hard mask. For example, an anisotropic etch, such as a reactive ion etch (RIE), using the photoresist is used to transfer the photoresist to the hard mask to form the patterned hard mask. The photoresist may be removed after patterning the hard mask.

Using the patterned hard mask, the substrate is etched. For example, an RIE etches the substrate, removing portions of the substrate exposed by the patterned hard mask. The etch transfers the pattern of the hard mask to the substrate. In one embodiment, the substrate is patterned to form a fin 110. The etch extends partially below, but not through, the first well, creating a fin with upper and lower portions, wherein the upper portion is formed by the surface substrate region and the lower portion is formed by the first well. The fin includes main and secondary fins.

Figure 6C:
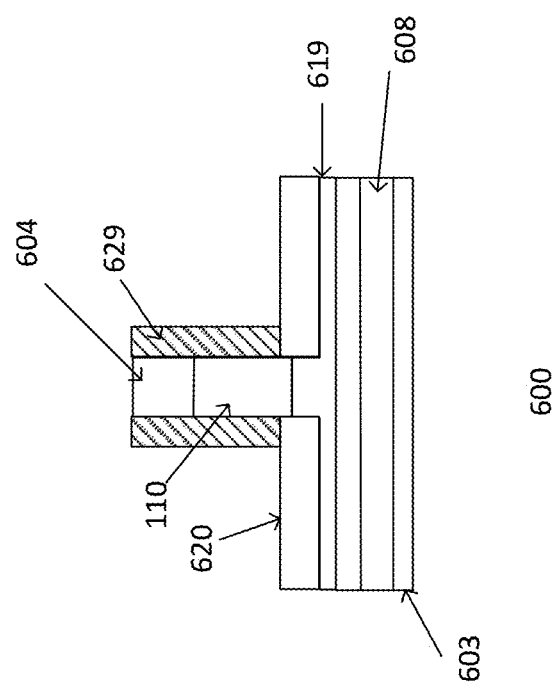

In FIG. 6c, a dielectric layer 620 is formed on the substrate. The dielectric layer fills the area between the substrate and top of the hard mask and covers the fins. The dielectric layer, for example, is silicon oxide or SiON. Other types of dielectric materials may also be useful. The dielectric layer may be formed by, for example, chemical vapor deposition (CVD). Other forming techniques may also be useful. Excess dielectric material is removed by a planarization process. In one embodiment, excess dielectric material is removed by chemical mechanical polishing (CMP). The CMP produces a planar surface with the top of the hard mask and dielectric layer.

After polishing, the dielectric layer is recessed. For example, etch back is performed to recess the dielectric layer. The etch back may be dry etch. Other techniques for recessing the dielectric layer may also be useful. The dielectric layer should be recessed to result in a height equal to, for example, the dielectric block 120 used to displace the PG from the side of the primary fin. The recessed dielectric layer should be less than a height of the PG to produce a tip in the FG. Additionally, the thickness of the recessed dielectric layer 620 should result in the top surface of the dielectric block disposed above the first well in the lower fin portion. The thickness of the dielectric layer 620, for example, may be about 25 nm. Other thicknesses may also be useful.

Spacers 629 are formed on sides of the fin 110. The spacers, for example, may be $Si_3N_4$ spacers. Other types of spacers may also be useful. For example, the spacer should be capable of being etched selective to the dielectric block and hard mask. To form the spacers, a spacer layer is formed on the substrate surface, lining the fin and dielectric layer 620. A RIE is performed to remove horizontal portions of the spacer layer, leaving spacers on sides of the fin. The thickness of the spacer layer is equal to about a width of the dielectric block to be formed. The thickness of the spacer layer, for example, is about 20 nm. Other thicknesses may also be useful.

Figure 6D:
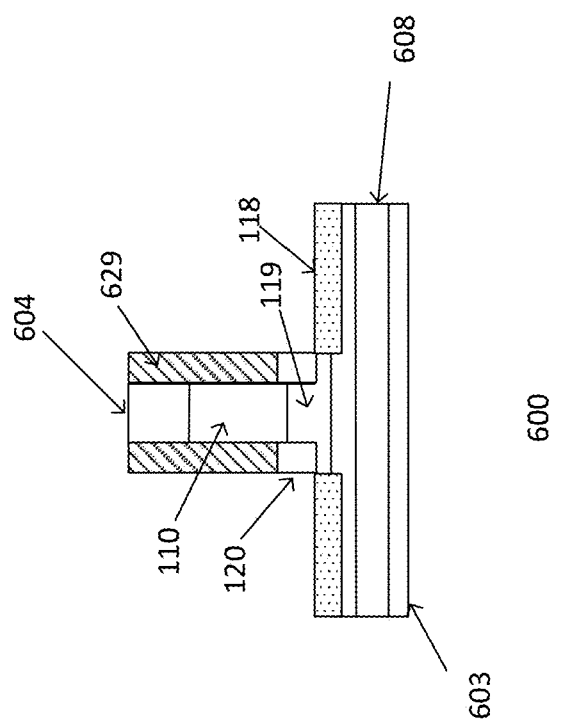

In FIG. 6d, the spacers and hard mask, serve as an etch mask to pattern the dielectric layer 620 to form the dielectric blocks 120. For example, a RIE is performed, removing the exposed portions of the dielectric layer to expose the substrate, such as the n-well. An implant is performed to form second wells 118. The second wells, for example, serve as contact regions for PGs. In one embodiment, the second well includes second polarity type dopants. The second well is heavily doped with second polarity type dopants.

Figure 6E:
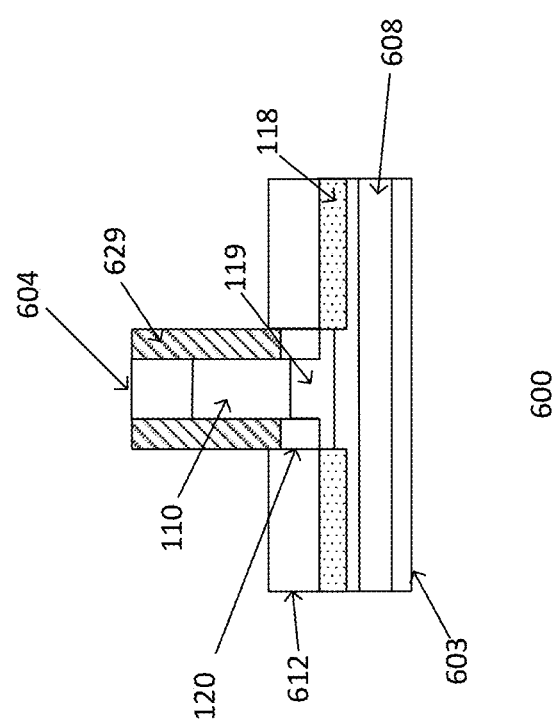

Referring to FIG. 6e, a PG layer 612 is formed on the substrate. The PG layer, for example, is a polysilicon layer or a metal layer. Other types of gate electrode layers may also be useful. The PG layer may be formed by CVD. Other techniques for forming the PG layer may also be useful. The PG layer overfills, resulting in a height which is at least above the fin and hard mask. Excess PG material is removed by, for example, CMP to form a planar surface with the hard mask and PG layer. The PG layer is recessed below the fin. Recessing the PG layer may be achieved by RIE. Other recessing techniques may also be useful. The PG layer is recessed to a height equal to about the PGs. The top surface of the PG layer is above the top of the dielectric block 120. The thickness of the PG layer, for example, is about 25 nm. Other thicknesses may also be useful.

Figure 6F:
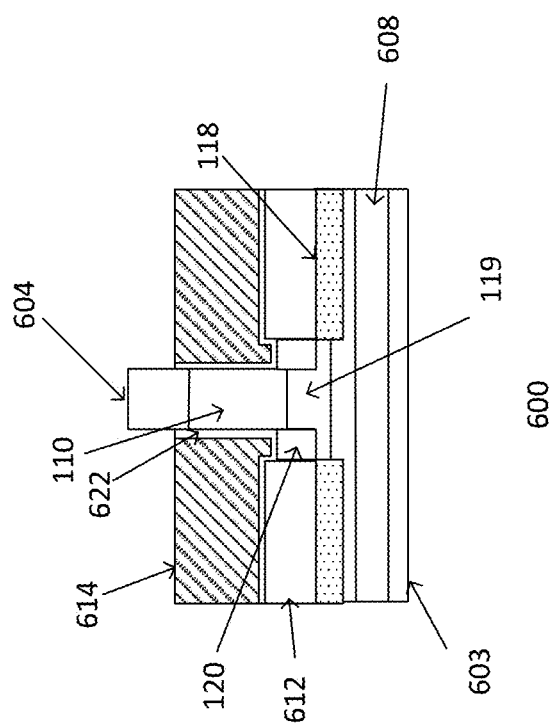

As shown in FIG. 6f, the spacers 629 are removed from the sides of the fin. The spacers may be removed by, for example, a wet etch. Other techniques for removing the spacers may also be useful. A dielectric layer 622 is formed. The dielectric layer, for example lines the PG gate and sides of the fin. The dielectric layer serves as a tunneling oxide layer or a part of an inter-gate dielectric layer. In one embodiment, the dielectric layer is formed by thermal oxidation. The thickness of the dielectric layer 622 may be about 8 nm. Other techniques for forming or thickness for the dielectric layer may also be useful.

A FG layer 614 is formed on the substrate. The FG layer, for example, is a polysilicon layer. Other types of gate electrode layers may also be useful. The FG layer may be formed by CVD. Other techniques for forming the FG layer may also be useful. The FG layer overfills the substrate. For example, the FG layer has a height which is at least above the top of the fin and hard mask. Excess FG material is removed by, for example, CMP to form a planar surface with the hard mask and FG layer. The FG layer is recessed below the fin. Recessing the FG layer may be achieved by RIE. Other recessing techniques may also be useful. The FG layer, for example, is recessed to about a top of the fin. The FG layer may have a top surface with is between slightly below or slightly above the top of the fin. Recessing the FG layer to other heights may also be useful. The thickness of the FG layer, for example, is about 40 nm. Other FG thicknesses may also be useful.

Figure 6G:
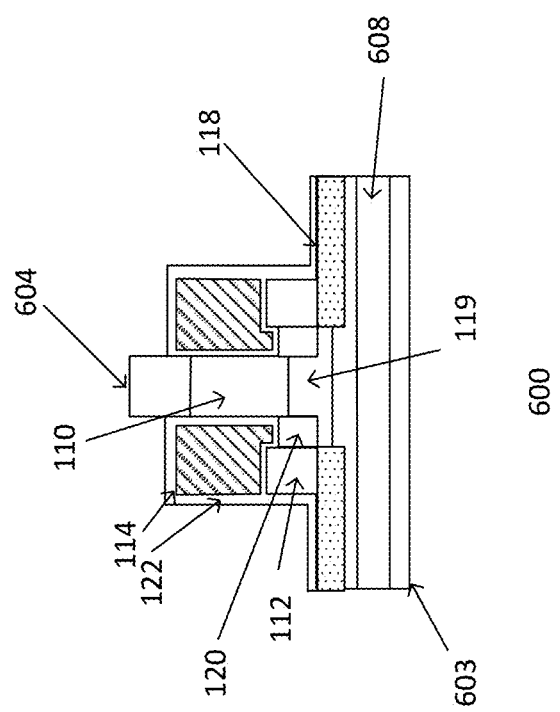

Referring to FIG. 6g, the FG and PG layers are patterned to form an FG/PG stack 114/112. Patterning the layer may be achieved by, for example, RIE using a photoresist etch mask. Other techniques for patterning the FG and PG layers may also be useful.

In FIG. 6g, an interpoly dielectric (IPD) layer is formed. The dielectric layer, for example, lines the FG/PG stack and sides of the hard mask. In one embodiment, the IPD layer may be formed by, for example, CVD. Other techniques, such as thermal oxidation may also be used to form the dielectric layer. The IPD layer along with the tunneling oxide form the inter-gate dielectric 122. The thickness of the IPD layer may be about 8 nm. Other thicknesses may also be useful.

Figure 6H:
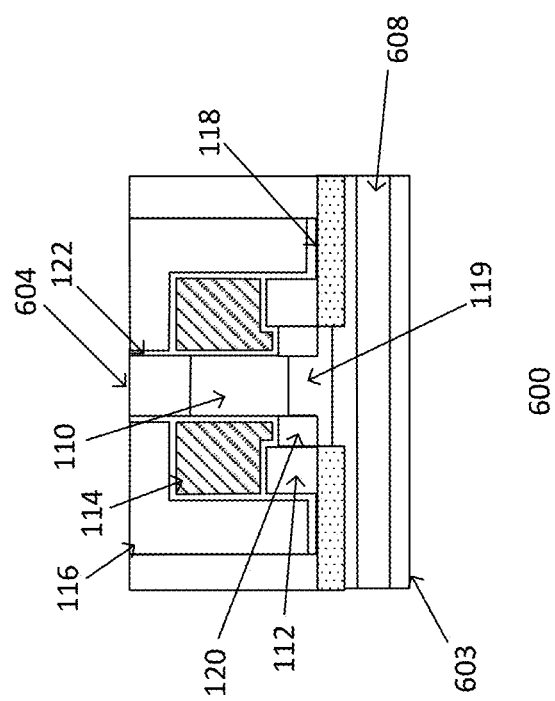

A CG layer is formed on the substrate, filling the cell area and covering the fin. A CG layer is formed on the substrate. The CG layer, for example, is a polysilicon layer or a metal layer. Other type of gate electrode layers may also be useful. The CG layer may be formed by CVD. Other techniques for forming the CG layer may also be useful. Excess CG material is removed by, for example, CMP to form a planar surface with the hard mask and CG layer. The substrate is patterned to form gate stacks of the memory cell. For example, the gate stack includes a CG 116 which wraps around the FG and sides of the PG, forming an L-shaped CG as shown in FIG. 6h. Pattering to form the gate stacks may be achieved by a RIE using a etch mask, such as photoresist. Patterning the gate stack also removes hard mask, exposing source and drain regions on the main and secondary fins.

Source and drain regions are formed. The source and drain regions are formed by implanting first polarity type dopants. In one embodiment, lightly doped and heavily doped regions are formed. For example, a first implant is performed to form lightly doped regions. The HM remaining on the portion of the fin between the adjacent gates serves as an implant mask. After forming the lightly doped regions, spacers are formed on sidewalls of the hard mask. After spacer formation, heavily doped regions are formed. Annealing may be performed to activate the dopants in the source and drain regions.

After formation of source and drain regions, silicide contacts may be formed. The silicide contacts may be formed over the source and drain regions. For example, silicide contacts are formed on exposed portions of the fin, including BLs and SLs. Additionally, silicide contacts may be formed over the CGs. Providing silicide contacts over the SLs advantageously reduces SL series resistance.

Additional processes are performed to form the device. This includes forming ILD layer and one or more interconnect levels, final passivation, dicing, assembly, packaging and testing. Other processes are also useful. For example, other components, such as low voltage, medium voltage, and high voltage I/O devices can be formed prior to forming the interconnections.

The process as described in FIGS. 6a-6h may be modified to form memory cells as described in FIGS. 5a-5c. For memory cells described in FIG. 5a, the process may be modified to form a CG layer over the recessed FG prior to forming gate stacks. In other words, FG/PG gate stack is not formed. Instead, the CG layer is formed over the FG layer. Afterwards, the CG, FG and PG layers are patterned to form gate stacks.

As for memory cells described in FIG. 5b, after forming the CG gate, the top of the CG gate is removed by, for example, the planarizing process, forming a co-planar top surface with CG, FG and hard mask. After planarization, the hard mask is removed. A dielectric layer is then formed over the top of the fin, CG and FG following forming the erase gate. The removal of the hard mask is optional and may not be necessary.

In the case of the memory cells of FIG. 5c, the process may be modified by providing a COI substrate. There is one single well 518 underneath BOX 560. The single well 518 is configured to connect to the PGs 112 since page program mode is used. In one embodiment, the single well 518 is a p-well that serves as an electrical contact for the PGs. After forming the well 518, a mask layer is formed on the substrate. The hard mask is patterned to form a fin. The insulator layer of the COI substrate is exposed. Spacers are formed on sides of the fin with the hard mask. The spacers and the hard mask are used as an etch mask to remove exposed portions of the insulator layer, leaving a dielectric block below the fin and spacers. The process then continues as described in FIG. 6d and onwards. As discussed, COI substrate can also be used with memory cells of FIGS. 5a and 5b.

In summary, in one aspect, a memory device in accordance with the present disclosure may include the following features: a primary fin disposed on a substrate along a first direction; first and second secondary fins disposed on the substrate along a second direction; and a first gate of a first memory cell disposed on the substrate in a gate region thereof. The first gate may include a program gate, a floating gate and a control gate. The program gate may be disposed on the substrate, where the program gate may be displaced from the primary fin by a dielectric block which is disposed on the substrate and adjacent to the primary fin. The dielectric block may have a height which is less than that of the program gate. The floating gate may be disposed over the program gate. The program gate may be separated from the floating gate and the primary fin by an inter-gate dielectric. The floating gate may include a floating gate tip disposed adjacent to the program gate and the dielectric block and between the program gate and the primary fin. The control gate may be disposed adjacent to the floating gate and the program gate. The control gate may be separated from the substrate, the program gate, and the floating gate by the inter-gate dielectric.

In one embodiment, the memory device may further include a source region and a drain region in the primary fin and disposed on opposing sides of the first gate.

In one embodiment, the memory device may further include a first well region in the substrate and in electrical contact with the program gate. During a program operation, electrons flow form the program gate to the floating gate through a poly-to-poly tunneling effect.

In one embodiment, the memory device may further include an isolation well below the primary fin and the secondary fins to electrically isolate the first memory cell from the substrate.

In one embodiment, the primary fin may be shared by the first gate of the first memory cell and a second gate of a second memory cell. The first and second gates may be disposed on opposing sides of the primary fin, and the first and second memory cells may form a column of memory cells.

In one embodiment, the first secondary fin may form a bit line for at least the first memory cell.

In one embodiment, the second secondary fin may form a source line for at least the first memory cell.

In one embodiment, the control gate may be coupled to a word line for at least the first memory cell.

In another aspect, a method of manufacturing a memory device may include: forming a primary fin on a substrate along a first direction; forming first and second secondary fins on the substrate along a second direction; and forming a first gate of a first memory cell on the substrate in a gate region thereof. In forming the first gate, the method may perform operations including: forming a program gate on the substrate; forming a dielectric block on the substrate and adjacent to the primary fin, wherein the program gate is displaced from the primary fin by the dielectric block, and wherein the dielectric block has a height which is less than that of the program gate; forming a floating gate over the program gate, wherein the floating gate comprises a floating gate tip disposed adjacent to the program gate and the dielectric block and between the program gate and the primary fin; forming an inter-gate dielectric, wherein the program gate is separated from the floating gate and the primary fin by the inter-gate dielectric; and forming a control gate adjacent to the floating gate and the program gate, wherein the control gate is separated from the substrate, the program gate, and the floating gate by the inter-gate dielectric.

In one embodiment, the method may further include forming a source region and a drain region in the primary fin and disposed on opposing sides of the first gate.

In one embodiment, the method may further include forming a first well region in the substrate, wherein the first well is in electrical contact with the program gate, and wherein during a program operation electrons flow from the program gate to the floating gate through a poly-to-poly tunneling effect.

In one embodiment, the method may further include forming an isolation well below the primary fin and the secondary fins to electrically isolate the first memory cell from the substrate.

In one embodiment, in forming the primary fin the method may form the primary fin to be shared by the first gate of the first memory cell and a second gate of a second memory cell, wherein the first and second gates are disposed on opposing sides of the primary fin, and wherein the first and second memory cells form a column of memory cells.

In one embodiment, in forming the first secondary fin the method may form the first secondary fin as a bit line for at least the first memory cell.

In one embodiment, in forming the second secondary fin the method may form the second secondary fin as a source line for at least the first memory cell.

In one embodiment, in forming the control gate the method may form the control gate such that the control gate is coupled to a word line for at least the first memory cell.

In another aspect, a memory device may include the following features: a substrate having a first primary side and a second primary side opposite the first primary side, the substrate including a well region therein that is doped with dopants of a first electrical polarity, the substrate having one or more fins protruding from the first primary side, a first fin of the one or more fins having a first side and a second side opposite the first side; a hard mask layer disposed over the first fin of the one or more fins; a first gate stack formed on the first side of the first fin; and a second gate stack formed on the second side of the first fin. The first gate stack may include a first section of a first polysilicon layer configured to function as a first program gate and disposed over the first primary side of the substrate. A first section of a second polysilicon layer may be configured to function as a first floating gate and disposed over the first program gate. A first section of a third polysilicon layer may be configured to function as a first control gate and disposed over the first floating gate. The second gate stack may include a second section of the first polysilicon layer configured to function as a second program gate and disposed over the first primary side of the substrate. A second section of the second polysilicon layer may be configured to function as a second floating gate and disposed over the second program gate. A second section of the third polysilicon layer may be configured to function as a second control gate and disposed over the second floating gate.

In one embodiment, the first floating gate may at least partially wrap around a corner of the first program gate that is closest to the hard mask layer when viewed along a longitudinal direction of the first fin.

In one embodiment, the second floating gate may at least partially wrap around a corner of the second program gate that is closest to the hard mask layer when viewed along the longitudinal direction of the first fin.

In one embodiment, the first control gate may have a generally L-shaped contour when viewed along a longitudinal direction of the first fin such that the first control gate is over and adjacent to the first floating gate and the first program gate.

In one embodiment, the second control gate may have a generally L-shaped contour when viewed along the longitudinal direction of the first fin such that the second control gate is over and adjacent to the second floating gate and the second program gate.

In one embodiment, the well region may include a deep well formed within the substrate between the first primary side and the second primary side of the substrate.

In one embodiment, the substrate may be doped with dopants of a second electrical polarity.

In one embodiment, the substrate may include a silicon-on-insulator (SOI) substrate.

In one embodiment, the substrate may further include a buried oxide (BOX) region between the well region and the first fin.

In one embodiment, the substrate may further include a shallow well region doped with dopants of the first electrical polarity. The shallow well region may be formed near the first primary side of the substrate and in a base region of the first fin where the first fin intersects with the first primary side of the substrate.

In one embodiment, the substrate may further include a source well region and a drain well region that are doped with dopants of a second electrical polarity. The first program gate may be disposed over one of the source well region and the drain well. The second program gate may be disposed over the other one of the source well region and the drain well region.

In one embodiment, the memory device may further include the following features: a first section of a dielectric layer disposed over the first primary side of the substrate between the first program gate and the first fin; a second section of the dielectric layer disposed over the first primary side of the substrate between the second program gate and the first fin; a first section of a tunnel oxide layer disposed between the first floating gate and each of the first program gate, the first section of the dielectric layer, and the first fin; a second section of the tunnel oxide layer disposed between the second floating gate and each of the second program gate, the second section of the dielectric layer, and the first fin; a first section of an inter-poly dielectric layer disposed between the first control gate and at least the first floating gate; and a second section of the inter-poly dielectric layer disposed between the second control gate and at least the second floating gate.

Thus, NVM devices, as described, are 3D 1T NVM devices with FinFET NVM structure. The 3D 1T NVM devices provide a number of benefits with respect to conventional and existing NVM devices. Firstly, the NVM devices according to the present disclosure have compact memory cell size compatible with FinFET logic process. Secondly, as the floating gates (FG) are separated by fin-shaped protrusions, the issue of FG-FG interference in conventional NVM devices is substantially minimized if not completely eliminated. Thirdly, NVM devices according to the present disclosure have lower SL series resistance. Additionally, cell current can be improved by height of the fin-shaped protrusions without scaled gate length. Further, as FG poly has a tip that at least partially wraps around a corner of the PG poly that is closest to the hard mask layer, electrical current flows quickly from the corner of the PG to the FG and to the fin during memory cell program and erase operations.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

What is claimed is:

1. A memory device, comprising:
   a primary fin disposed on a substrate along a first direction;
   first and second secondary fins disposed on the substrate along a second direction; and
   a first gate of a first memory cell disposed on the substrate in a gate region thereof, wherein the first gate comprises
      a program gate disposed on the substrate, wherein the program gate is displaced from the primary fin by a dielectric block which is disposed on the substrate and adjacent to the primary fin, and wherein the dielectric block has a height which is less than that of the program gate,
      a floating gate disposed over the program gate, wherein the program gate is separated from the floating gate and the primary fin by an inter-gate dielectric, and wherein the floating gate comprises a floating gate tip disposed adjacent to the program gate and the dielectric block and between the program gate and the primary fin, and
      a control gate disposed adjacent to the floating gate and the program gate, wherein the control gate is separated from the substrate, the program gate, and the floating gate by the inter-gate dielectric.

2. The memory device of claim 1, further comprising a source region and a drain region in the primary fin and disposed on opposing sides of the first gate.

3. The memory device of claim 1, further comprising a first well region in the substrate and in electrical contact with the program gate, wherein during a program operation electrons flow from the program gate to the floating gate through a poly-to-poly tunneling effect.

4. The memory device of claim 1, further comprising an isolation well below the primary fin and the secondary fins to electrically isolate the first memory cell from the substrate.

5. The memory device of claim 1, wherein the primary fin is shared by the first gate of the first memory cell and a second gate of a second memory cell, wherein the first and second gates are disposed on opposing sides of the primary fin, and wherein the first and second memory cells form a column of memory cells.

6. The memory device of claim 1, wherein the first secondary fin forms a bit line for at least the first memory cell.

7. The memory device of claim 1, wherein the second secondary fin forms a source line for at least the first memory cell.

8. The memory device of claim 1, wherein the control gate is coupled to a word line for at least the first memory cell.

9. A method of manufacturing a memory device, comprising:
   forming a primary fin on a substrate along a first direction;
   forming first and second secondary fins on the substrate along a second direction; and
   forming a first gate of a first memory cell on the substrate in a gate region thereof, wherein forming the first gate comprises
      forming a program gate on the substrate,
      forming a dielectric block on the substrate and adjacent to the primary fin, wherein the program gate is displaced from the primary fin by the dielectric block, and wherein the dielectric block has a height which is less than that of the program gate,
      forming a floating gate over the program gate, wherein the floating gate comprises a floating gate tip disposed adjacent to the program gate and the dielectric block and between the program gate and the primary fin,
      forming an inter-gate dielectric, wherein the program gate is separated from the floating gate and the primary fin by the inter-gate dielectric, and
      forming a control gate adjacent to the floating gate and the program gate, wherein the control gate is separated from the substrate, the program gate, and the floating gate by the inter-gate dielectric.

10. The method of claim 9, further comprising forming a source region and a drain region in the primary fin and disposed on opposing sides of the first gate.

11. The method of claim 9, further comprising forming a first well region in the substrate, wherein the first well is in electrical contact with the program gate, and wherein during a program operation electrons flow from the program gate to the floating gate through a poly-to-poly tunneling effect.

12. The method of claim 9, further comprising forming an isolation well below the primary fin and the secondary fins to electrically isolate the first memory cell from the substrate.

13. The method of claim 9, wherein forming the primary fin comprises forming the primary fin to be shared by the first gate of the first memory cell and a second gate of a second memory cell, wherein the first and second gates are disposed on opposing sides of the primary fin, and wherein the first and second memory cells form a column of memory cells.

14. The method of claim 9, wherein forming the first secondary fin comprises forming the first secondary fin as a bit line for at least the first memory cell.

15. The method of claim 9, wherein forming the second secondary fin comprises forming the second secondary fin as a source line for at least the first memory cell.

16. The method of claim 9, wherein forming the control gate comprises forming the control gate such that the control gate is coupled to a word line for at least the first memory cell.

17. A memory device, comprising:
a substrate having a first primary side and a second primary side opposite the first primary side, the substrate including a well region therein that is doped with dopants of a first electrical polarity, the substrate having one or more fins protruding from the first primary side, a first fin of the one or more fins having a first side and a second side opposite the first side;
a hard mask layer disposed over the first fin of the one or more fins;
a first gate stack formed on the first side of the first fin; and
a second gate stack formed on the second side of the first fin,
wherein the first gate stack comprises a first section of a first polysilicon layer configured to function as a first program gate and disposed over the first primary side of the substrate, a first section of a second polysilicon layer configured to function as a first floating gate and disposed over the first program gate, and a first section of a third polysilicon layer configured to function as a first control gate and disposed over the first floating gate, and
wherein the second gate stack comprises a second section of the first polysilicon layer configured to function as a second program gate and disposed over the first primary side of the substrate, a second section of the second polysilicon layer configured to function as a second floating gate and disposed over the second program gate, and a second section of the third polysilicon layer configured to function as a second control gate and disposed over the second floating gate.

18. The memory device of claim 17, wherein the first floating gate at least partially wraps around a corner of the first program gate that is closest to the hard mask layer when viewed along a longitudinal direction of the first fin.

19. The memory device of claim 17, wherein the first control gate has a generally L-shaped contour when viewed along a longitudinal direction of the first fin such that the first control gate is over and adjacent to the first floating gate and the first program gate.

20. The memory device of claim 17, wherein the substrate comprises a silicon-on-insulator (SOI) substrate.

* * * * *